(12) United States Patent
Nemoto

(10) Patent No.: US 6,867,366 B2
(45) Date of Patent: Mar. 15, 2005

(54) SEMICONDUCTOR INTEGRATED APPARATUS

(75) Inventor: Kazuhiko Nemoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/745,015

(22) Filed: Dec. 23, 2003

(65) Prior Publication Data

US 2005/0029002 A1 Feb. 10, 2005

(30) Foreign Application Priority Data

Dec. 26, 2002 (JP) ........................................ 2002-377608

(51) Int. Cl.$^7$ ............................................. H02L 23/02
(52) U.S. Cl. ..................................... 174/52.4; 257/680
(58) Field of Search ............................... 174/52.3, 52.4; 257/680, 681

(56) References Cited

U.S. PATENT DOCUMENTS

| | | | | |
|---|---|---|---|---|
| 5,748,658 A | * | 5/1998 | Nakanishi et al. ............ 372/43 |
| 6,649,834 B1 | * | 11/2003 | Hsieh et al. ................ 174/52.1 |
| 6,653,724 B1 | * | 11/2003 | Kim et al. ................... 257/684 |
| 6,656,768 B2 | * | 12/2003 | Thomas ....................... 438/108 |
| 6,670,221 B2 | * | 12/2003 | Sakoda et al. .............. 438/112 |

* cited by examiner

Primary Examiner—Hung V. Ngo
(74) Attorney, Agent, or Firm—Sonnenschein, Nath & Rosenthal LLP

(57) ABSTRACT

Heat removal while a semiconductor laser emits a laser beam, and heat insulation with respect to optical devices are sought to be improved. A semiconductor integrated apparatus is so configured to include a base member formed of a metal material or a ceramic material, a housing formed of a resin material or a glass material, and a device arrangement block. A substrate on which are mounted predetermined optical devices including a semiconductor laser is placed on the base member. The housing covers the substrate placed on the base member. The device arrangement block is attached to the housing and has optical devices that are different from those described above.

8 Claims, 3 Drawing Sheets

SEMICONDUCTOR INTEGRATED APPARATUS

CROSS REFERENCE TO RELATED APPLICATIONS

The present document claims priority to Japanese Priority Document JP 2002-377608, filed in the Japanese Patent Office on Dec. 26, 2002, the entire contents of which are incorporated herein by reference to the extent permitted by law.

BACKGROUND OF THE INVENTION

1. Field of the Invention

The present invention relates to a semiconductor integrated apparatus. More specifically, the present invention relates to a field of technology for improving heat removal in semiconductor lasers, and for improving heat insulation with respect to optical devices.

2. Description of the Related Art

For example, there exists a kind of semiconductor integrated apparatus that is provided in an optical pickup of a disk drive apparatus. Such a semiconductor integrated apparatus has a substrate, on which are mounted predetermined optical devices such as a semiconductor laser, a photo detector, a prism and the like, placed inside a package.

As an example of a conventional semiconductor integrated apparatus, there is one in which such optical devices as a semiconductor laser, a photo detector and the like are arranged inside a recessed portion formed in a package. A device arrangement block ("optical device 2" in patent document 1 below) having a hologram section and the like is attached to the package, and the various optical devices such as the semiconductor laser, the photo detector and the like are covered by the device arrangement block (see patent document 1).

Patent Document 1

Japanese Patent Application Publication No. 2002-237073

In the conventional semiconductor integrated apparatus above, if, for example, the package is ceramic, favorable heat removal can be attained when a laser beam is emitted from the semiconductor laser.

SUMMARY OF THE INVENTION

However, in the conventional semiconductor integrated apparatus above, since the device arrangement block is attached to the package, heat is easily conducted to the device arrangement block in soldering, for example, a flexible print wiring board to the semiconductor integrated apparatus in assembling an optical pickup, and therefore, the functionality of the optical devices, such as the hologram section and the like, could be degraded.

On the contrary, if the package is formed of a resin material or the like, the heat generated when a laser beam is emitted from the semiconductor laser is not conducted well to the device arrangement block. Therefore, the effect the heat from soldering a flexible print wiring board, for example, has on the optical devices, such as the hologram section, is smaller, but heat removal during emission of a laser beam from the semiconductor laser is compromised, and the reliability of the semiconductor integrated apparatus' operation may suffer.

As such, the present invention seeks to improve heat removal in semiconductor lasers and improve heat insulation for optical devices.

A semiconductor integrated apparatus related to an embodiment of the present invention is comprised of a base member formed of a metal material or a ceramic material and on which is placed a substrate having predetermined optical devices, including a semiconductor laser, mounted thereon; a housing formed of a resin material or a glass material and which covers the substrate mentioned above placed on the base member mentioned above; and a device arrangement block attached to the housing and which has an optical device that is different from the predetermined optical devices mentioned above.

Therefore, in a semiconductor integrated apparatus related to an embodiment of the present invention, there is provided, between the device arrangement block and the base member formed of a metal material or a ceramic material, the housing formed of a resin material or a glass material.

As a result, the base member formed of a metal material or a ceramic material has a high thermal conductivity and favorable heat removal during emission of a laser beam from the semiconductor laser is attained. In addition, the housing formed of a resin material or a glass material has superior heat resistant and heat insulating properties, and thus, the effects the heat from soldering a wiring board has on the optical devices of the device arrangement block (e.g. the hologram section) is mitigated.

DESCRIPTION OF A PREFERRED EMBODIMENT

An embodiment of a semiconductor integrated apparatus related to the present invention is described below with reference to the appended drawings.

A semiconductor integrated apparatus 1 is arranged on, for example, a movable base of an optical pickup provided in a disk drive apparatus. The movable base is moved in the radial direction of a disc-shaped recording medium when information signals are recorded on or read from the disc-shaped recording medium. A wiring board (e.g. a flexible print wiring board) connected to a drive circuit is attached on the movable base, and an external electrode is formed on one end of the flexible print wiring board.

Figure 1:
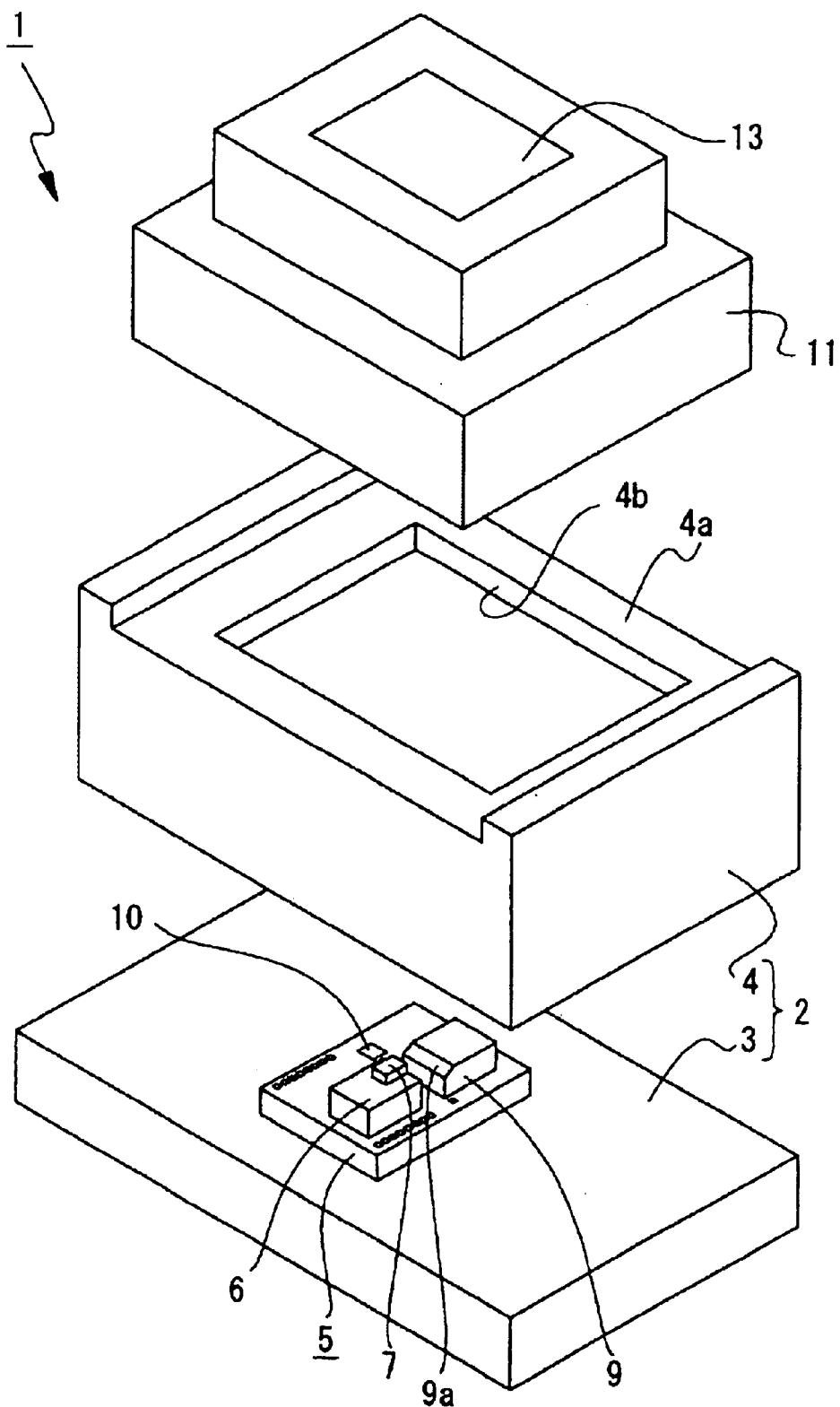
FIG. 1 is an exploded perspective view of a semiconductor integrated apparatus, and shows an embodiment of the present invention.
Figure 2:
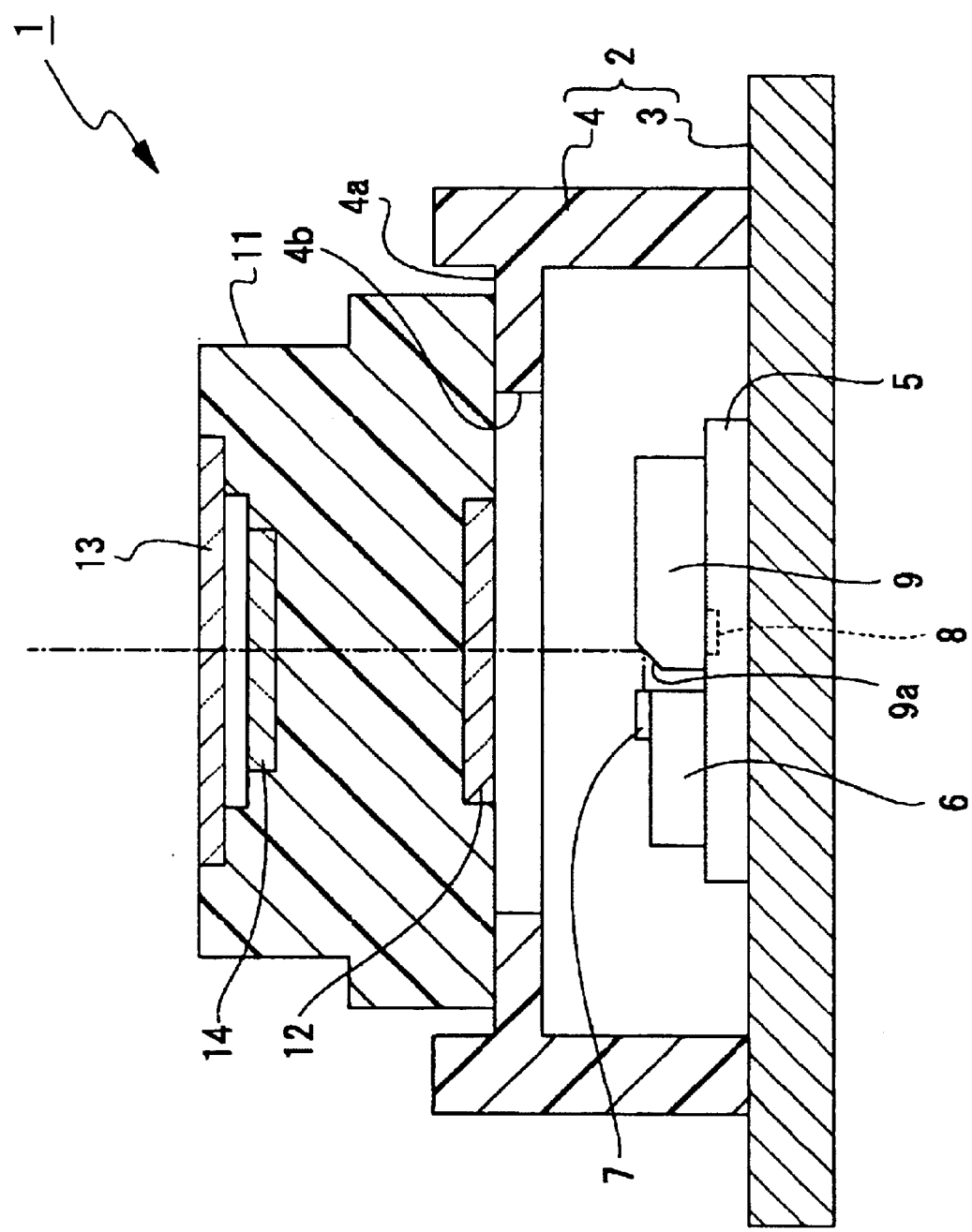
FIG. 2 is an enlarged sectional view of a semiconductor integrated apparatus, and shows an embodiment of the present invention.

In the semiconductor integrated apparatus 1, various parts are provided in a package 2. As shown in FIG. 1 and FIG. 2, the package 2 is comprised of a base member 3 formed in the shape of a flat plate of a metal material or ceramic material having high thermal conductivity, and a housing 4 formed of a resin material or glass material having superior heat resistant and heat insulating properties.

As the metal material for the base member 3, copper, iron, aluminum and the like, for example, may be used, and as the ceramic material for the base member 3, alumina, aluminum nitride and the like, for example, may be used. On both the upper and lower surfaces of the base member 3 is provided an electrode (not shown) for conduction between a substrate and an external electrode of the wiring board (flexible print wiring board) mentioned above. Both the substrate and the external electrode will be described later.

The housing 4 has the shape of a box with its lower side open. An opening 4b is formed in its upper surface 4a. As the resin material for the housing 4, thermosetting resins such as phenolic hardened novolak epoxy resin and the like, thermoplastic resins such as liquid crystal polymers, polyphenylene sulfide, econol, polyethyl ether ketone and the like may be used, for example. As the glass material for the housing 4, low-melting glass may be used, for example.

Figure 3:
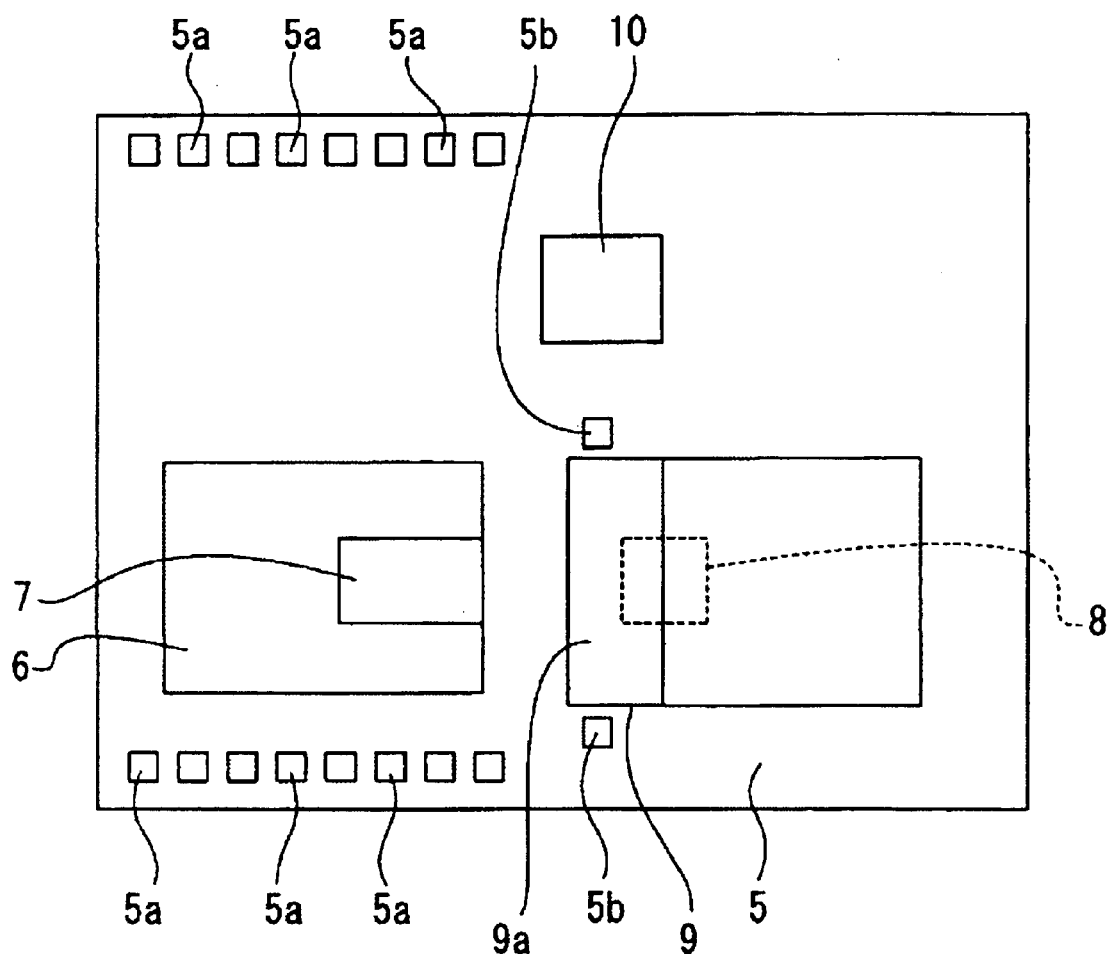
FIG. 3 is an enlarged plan view showing optical devices arranged on a substrate, and shows an embodiment of the present invention.

A substrate 5 is provided on the base member 3. As shown in FIG. 3, there are provided on the substrate 5 a plurality of electrodes 5a, 5a. . . , and alignment marks 5b, 5b.

On the substrate 5 is provided a sub-mount 6 with a silver paste interposed between itself and the substrate 5, and a semiconductor laser 7 is provided on the sub-mount 6. A front photo diode 8 having APC (Automatic Power Control) functions for controlling the laser light emitted from the semiconductor laser 7 so that the intensity is held constant is provided on the upper surface of he substrate 5.

A prism 9 is attached on the substrate 5 through an adhesive, and the prism 9 is so positioned as to cover the front photo diode 8. There is formed on the prism 9 a slanted reflective surface 9a at a position facing the semiconductor laser 7.

The prism 9 is positioned between the alignment marks 5b, 5b provided on the substrate 5. And the positioning of the prism 9 with respect to the substrate 5 is determined by these alignment marks 5b, 5b.

A photo detector 10 is provided on the substrate 5 towards the prism 9.

A device arrangement block 11 is attached on the upper surface 4a of the housing 4 (see FIG. 1 and FIG. 2). The device arrangement block 11 is, for example, formed of a resin material. A grating 12 is positioned in a center portion on the lower end section of the device arrangement block 11 as shown in FIG. 2. A quarter-wave plate 13 is provided in a center portion on the upper end section of the device arrangement block 11.

In the device arrangement block 11, there is provided below the quarterwave plate 13 a hologram 14 with a predetermined gap in between. The hologram 14 is an optical device that has optical path altering functions for altering the path of a laser beam, as well as light dividing functions for dividing a laser beam.

In the semiconductor integrated apparatus thus configured, when a laser beam is emitted from the semiconductor laser 7, the emitted laser beam is reflected by the reflective surface 9a of the prism 9, and its optical path is altered by 90° (see FIG. 2). The laser beam, whose optical path has been altered, passes through the opening 4b in the housing 4, travels towards an objective lens (not shown) via the grating 12, the hologram 14 and the quarter-wave plate 13, and is focused on the recording surface of a disc-shaped recording medium by the objective lens. The laser beam that has been focused on the recording surface of the disc-shaped recording medium is reflected by the recording surface and is made to enter the hologram 14 from the quarter-wave plate 13 via the objective lens. The laser beam that has entered the hologram 14 has its optical path altered, and enters the photo diode 10. Thus, for example, information signals recorded on the disc-shaped recording medium may be read.

As described above, when a laser beam is emitted from the semiconductor laser 7, part of the laser beam is transmitted through the prism 9 to enter the front photo diode 8. The laser beam that enters the front photo diode 8 has its intensity detected, and based on the detected intensity, the output of the semiconductor laser 7 is controlled so that the intensity of the laser beam emitted from the semiconductor laser 7 remains constant.

As described above, the semiconductor integrated apparatus 1 has a structure in which the housing 4 formed of a resin material or a glass material is provided between the device arrangement block 11 and the base member 3 formed of a metal material or a ceramic material. Therefore, favorable heat removal can be attained through the thermally conductive base member 3 when a laser beam is emitted from the semiconductor laser 7, and the effects the heat from, for example, soldering a flexible print wiring board has on the optical devices of the device arrangement block 11 (e.g. the hologram 14 and the like) can be mitigated with the housing 4, which has superior heat resistant and heat insulating properties.

In addition, because the package 2 is comprised of two parts, namely the base member 3 and the housing 4, the freedom of design with respect to the shape of the package 2 and the like is higher, and it is possible to make the semiconductor integrated apparatus 1 smaller and thinner at lower costs.

Further, because a space for placing the substrate 5, on which the semiconductor laser 7 and the like are provided, is formed with the housing 4, there is no need to form a recessed portion in the base member 3 for placing the substrate 5, and the base member 3 can therefore be formed in the shape of a simple flat plate, thereby making it easier to implement designs for enhancing heat removal functions.

Further, by forming the base member 3 with a ceramic material, the electrode provided on the base member 3 can be positioned more freely, and the freedom of design is improved. In particular, by providing on the lower surface of the base member 3 an electrode for connecting with the wiring board (flexible print wiring board), the risk of physical contact between the soldering iron and the optical devices positioned on the upper side of the base member 3 during the soldering process for the wiring board is reduced, and defects caused by the soldering process can be prevented.

In addition, by forming the housing 4 with a resin material or a glass material, the freedom of design with respect to the shape of the housing 4 and its dimensional accuracy can be improved. Thus, the positioning of the device arrangement block 11 with respect to the housing 4 can be made more accurate, and the device arrangement block 11 can be made a shape in which optical functionality is prioritized.

Although an example in which an embodiment of the present invention is applied to a semiconductor apparatus provided in an optical pickup of a disk drive apparatus is given, the present invention is by no means restricted thereto, and may be applied to semiconductor integrated apparatuses used in various electronic devices.

The shapes and structures of the various components in the embodiment described above are illustrative of only one example in implementing the present invention, and are not to be construed restrictive. The scope of the invention is to be indicated by the appended claims, rather than by the foregoing description, and all changes which come within the meaning and range of equivalents of the claims are intended to be embraced therein.

What is claimed is:

1. A semiconductor integrated apparatus, comprising:

a base member formed of one of a metal material and a ceramic material, and on which a substrate having optical devices including at least a semiconductor laser, a photo detector, and a prism mounted thereon is placed;

a housing formed of one of a resin material and glass material, and which covers said substrate provided on said base member; and a device arrangement block attached to said housing and which includes at least a quarter-wave plate, a hologram, and a grating.

2. The semiconductor integrated apparatus according to claim 1, wherein said metal material for said base member includes copper, iron and aluminum.

3. The semiconductor integrated apparatus according to claim 1, wherein said ceramic material for said base member includes alumina and aluminum nitride.

4. The semiconductor integrated apparatus according to claim 1, wherein said resin material for said housing includes thermosetting resin and thermoplastic resin.

5. The semiconductor integrated apparatus according to claim 4, wherein said thermosetting resin includes a phenolic hardened novolak epoxy resin.

6. The semiconductor integrated apparatus according to claim 4, wherein said thermoplastic resin includes liquid crystal polymer, polyphenylene sulfide, econol, and polyethyl ether ketone.

7. The semiconductor integrated apparatus according to claim 1, wherein said glass material for said housing includes low-melting glass.

8. The semiconductor integrated apparatus according to claim 1, wherein said optical devices mounted on said substrate include at least a semiconductor laser, a prism, a photo detector and a front photo diode.

* * * * *